(12) United States Patent
Jeon (10) Patent No.: US 9,748,447 B2
(45) Date of Patent: Aug. 29, 2017

(54) SEMICONDUCTOR LIGHT EMITTING DEVICE (71) Applicant: SEMICON LIGHT CO., LTD., Gyeonggi-do (KR)

(72) Inventor: Soo Kun Jeon, Gyeonggi-do (KR)

(73) Assignee: SEMICON LIGHT CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/036,134

(22) PCT Filed: Nov. 12, 2014

(86) PCT No.: PCT/KR2014/010858
§ 371 (c)(1),
(2) Date: Aug. 5, 2016

(87) PCT Pub. No.: WO2015/072746
PCT Pub. Date: May 21, 2015

(65) Prior Publication Data
US 2016/0343914 A1    Nov. 24, 2016

(30) Foreign Application Priority Data
Nov. 12, 2013   (KR) .................. 10-2013-0136889

(51) Int. Cl.
*H01L 33/00*   (2010.01)
*H01L 33/46*   (2010.01)
(Continued)

(52) U.S. Cl.
CPC .............. *H01L 33/46* (2013.01); *H01L 33/10* (2013.01); *H01L 33/38* (2013.01); *H01L 33/405* (2013.01); *H01L 33/62* (2013.01)

(58) Field of Classification Search
CPC ......... H01L 33/46; H01L 33/38; H01L 33/40; H01L 33/405; H01L 33/10; H01L 33/62
(Continued)

(56) References Cited

U.S. PATENT DOCUMENTS

| 2004/0126489 A1* | 7/2004 | Fuchs .................. C09K 11/613 427/248.1 |
| 2006/0186540 A1* | 8/2006 | Buchwalter ......... H01L 21/4853 257/737 |

(Continued)

FOREIGN PATENT DOCUMENTS

| JP | 2013-214426 | 10/2013 | ................ F21S 2/00 |
| KR | 10-2007-0041506 | 4/2007 | ............. H01L 33/36 |

(Continued)

OTHER PUBLICATIONS

International Search Report (ISR) dated Dec. 29, 2014 in PCT/KR2014/010858 with English translation.

*Primary Examiner* — Tu-Tu Ho
(74) *Attorney, Agent, or Firm* — Harness, Dickey & Pierce, P.L.C.

(57) ABSTRACT

Disclosed is a semiconductor light emitting device including: a plurality of semiconductor layers; and a first electrode which is formed on an exposed region of the first semiconductor layer created by mesa etching portions of the second semiconductor layer, the active layer and the first semiconductor layer, and includes a contact layer in contact with the first semiconductor layer, a reflective layer formed on the contact layer, while facing an exposed region of the active layer created by mesa etching and reflecting light, and an anti-rupture layer formed on the reflective layer.

7 Claims, 9 Drawing Sheets

(51) Int. Cl.
  *H01L 33/38*  (2010.01)
  *H01L 33/40*  (2010.01)
  *H01L 33/10*  (2010.01)
  *H01L 33/62*  (2010.01)

(58) Field of Classification Search
  USPC .......................................................... 257/98
  See application file for complete search history.

(56) References Cited

U.S. PATENT DOCUMENTS

| | | | |
|---|---|---|---|
| 2009/0184329 A1 | 7/2009 | Miki et al. | 257/79 |
| 2011/0018022 A1 | 1/2011 | Okabe et al. | 257/98 |
| 2012/0168803 A1* | 7/2012 | Lee | H01L 33/40 |
| | | | 257/98 |
| 2014/0361327 A1* | 12/2014 | Chae | H01L 33/22 |
| | | | 257/98 |

FOREIGN PATENT DOCUMENTS

| KR | 10-2010-0133997 | 12/2010 | ............. H01L 33/40 |
| KR | 10-2013-0071834 | 7/2013 | ............. H01L 33/36 |

* cited by examiner

SEMICONDUCTOR LIGHT EMITTING DEVICE

CROSS-REFERENCE TO RELATED APPLICATIONS

This application is a national phase application of PCT Application No. PCT/KR2014/010858, filed on Nov. 12, 2014, which claims the benefit and priority to Korean Patent Application No. 10-2013-0136889, filed Nov. 12, 2013. The entire disclosures of the applications identified in this paragraph are incorporated herein by references.

FIELD

The present disclosure relates generally to a semiconductor light emitting device, and more particularly to a semiconductor light emitting device without rupture of the electrode.

In the context herein, the term "semiconductor light emitting device" is intended to indicate a semiconductor optoelectronic device which generates light by electron-hole recombination. One example thereof is Group III-nitride semiconductor light emitting devices, in which the Group III-nitride semiconductor is made of a compound $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

BACKGROUND

This section provides background information related to the present disclosure which is not necessarily prior art.

Figure 1:
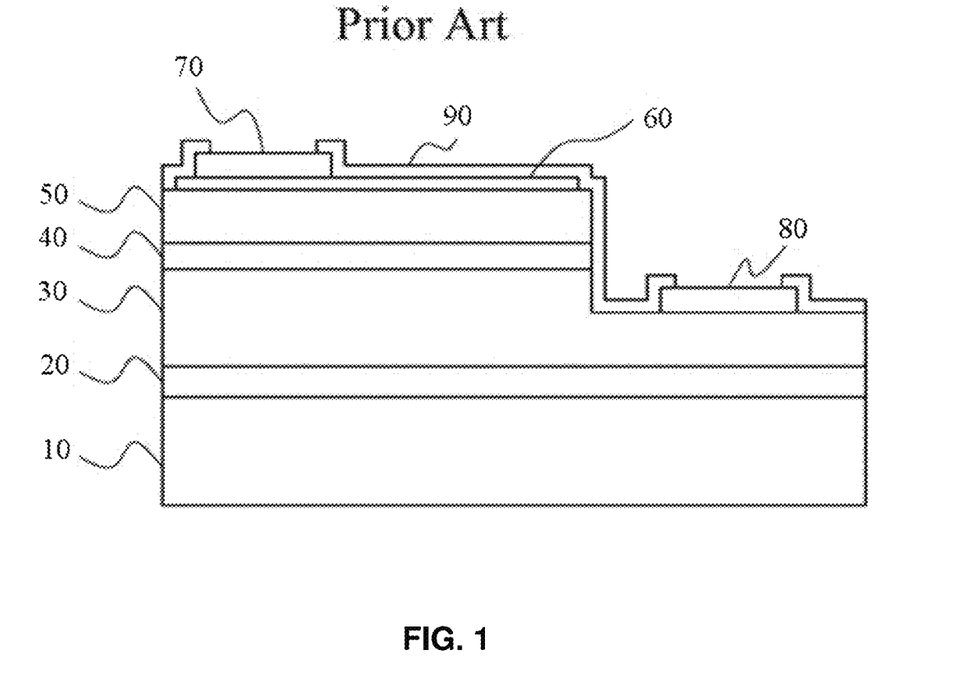
FIG. 1 shows an exemplary embodiment of a conventional Group III-nitride semiconductor light emitting device.

FIG. 1 shows an exemplary embodiment of a conventional Group III-nitride semiconductor light emitting device. The Group III-nitride semiconductor light emitting device includes a substrate 10 (e.g. a sapphire substrate), a buffer layer 20 grown on the substrate 10, an n-type Group III-nitride semiconductor layer 30 grown on the buffer layer 20, an active layer 40 grown on the n-type Group III-nitride semiconductor layer 30, a p-type Group III-nitride semiconductor layer 50 grown on the active layer 40, a current spreading conductive film 60 formed on the p-type Group III-nitride semiconductor layer 50, a p-side bonding pad 70 formed on the current spreading conductive film 60, an n-side bonding pad 80 formed on an exposed region of the n-type Group III-nitride semiconductor layer 30 created by mesa etching the p-type Group III-nitride semiconductor layer 50 and the active layer 40, and a protective film 90.

The current spreading conductive film 60 is provided to facilitate a smooth current supply to the entire p-type Group III-nitride semiconductor layer 50. The current spreading conductive film 60 is formed nearly over the entire surface of the p-type Group III-nitride semiconductor layer 50, and it may take the form of a light transmitting conductive film made of ITO, ZnO or Ni/Au, or a reflecting conductive film made of Ag, for example.

The p-side bonding pad 70 and the n-side bonding pad 80 are electrodes used for supplying current and wire bonding externally.

The protective film 90 is made of materials such as silicon dioxide, and may be omitted.

Figure 2:
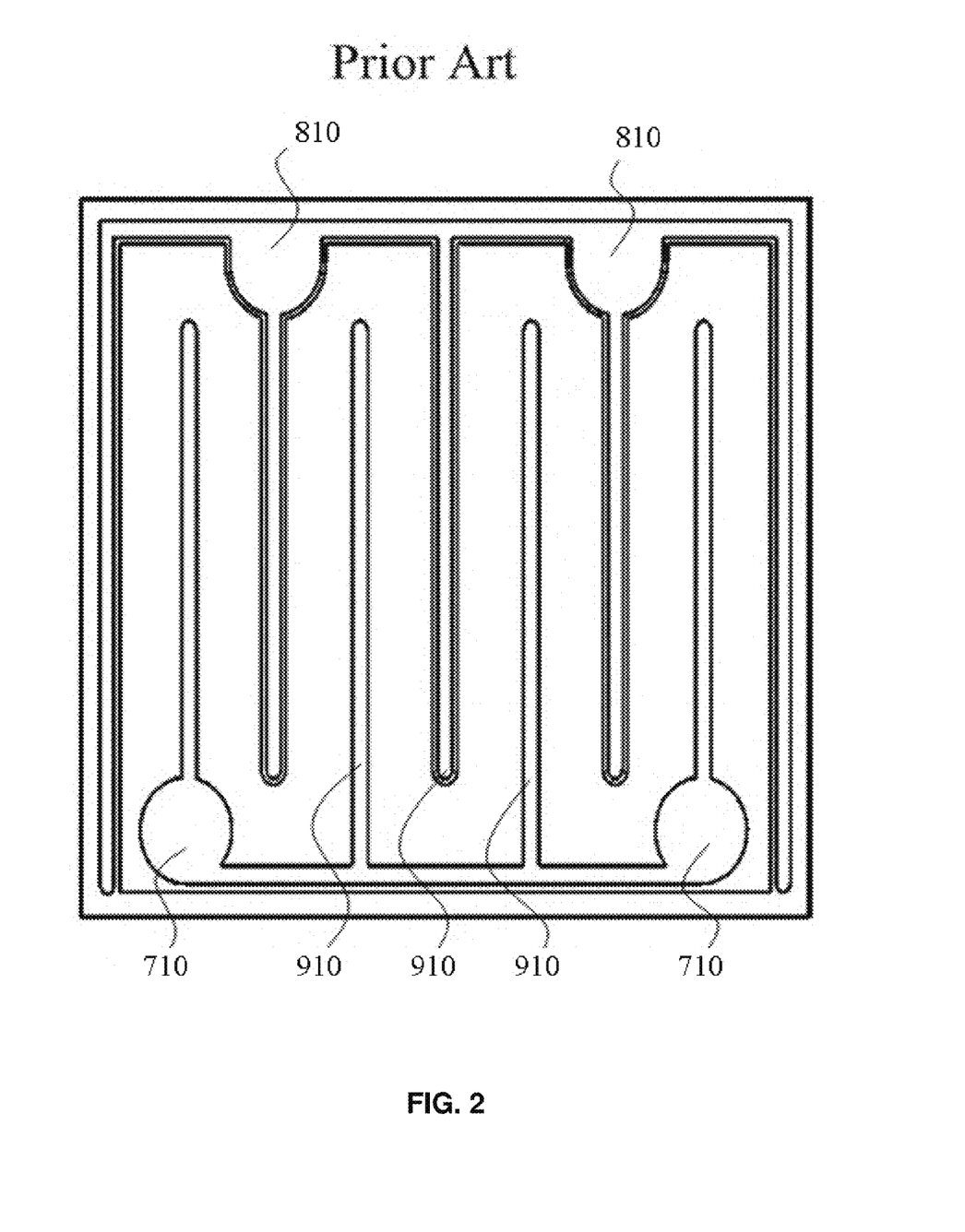
FIG. 2 shows one example of the electrode structure disclosed in U.S. Pat. No. 6,307,218.

As there is an increasing demand for a large area, high-power semiconductor light emitting device, finger electrodes and multiple bonding pads have been introduced to facilitate current spreading within the semiconductor lighting emitting device. For example, FIG. 2 shows one example of the electrode structure disclosed in U.S. Pat. No. 6,307,218 which describes a technology for improving current spreading by means of finger electrodes 910 equidistantly spaced apart between the p-side bonding pad 710 and the n-side bonding pad 810, following the trend towards large semiconductor light emitting devices.

However, these bonding pads and finger electrodes which are made of metallic materials are thick and have a high absorption loss of light, leading to degradation of the light extraction efficiency of the semiconductor light emitting device.

In particular, a considerable amount of the light emitted from those mesa-etched faces of the p-type Group III-nitride semiconductor layer 50, the active layer 40 and the n-type Group III-nitride semiconductor layer 30 is absorbed by the lateral sides of the electrodes, or gets lost as the light travels sideways, failing to obtain effective light emission.

DISCLOSURE

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a semiconductor light emitting device including: a plurality of semiconductor layers which includes a first semiconductor layer having a first conductivity type, a second semiconductor layer having a second conductivity type different from the first conductivity type, and an active layer arranged between the first semiconductor layer and the second semiconductor layer and adapted to generate light by electron-hole recombination; and a first electrode which is formed on an exposed region of the first semiconductor layer created by mesa etching portions of the second semiconductor layer, the active layer and the first semiconductor layer, and includes a contact layer in contact with the first semiconductor layer, a reflective layer formed on the contact layer, while facing an exposed region of the active layer created by mesa etching and reflecting light, and an anti-rupture layer formed on the reflective layer, wherein the reflective layer has a higher reflectivity than that of the anti-rupture layer and a thickness of at least 500 Å, and the anti-rupture layer has a lower thermal expansion coefficient than that of the reflective layer, thereby preventing rupture of the reflective layer that occurs upon the application of power.

Advantageous Effects

The advantageous effects of the present disclosure will be described in the latter part of the best mode for carrying out the invention.

EMBODIMENTS

Hereinafter, the present disclosure will now be described in detail with reference to the accompanying drawings. The following description is presented for purposes of illustration only and not of limitation as the scope of the invention is defined by the appended claims. For example, the steps mentioned in any of the method or process may be executed in any order and are not necessarily limited to the order provided. Also, any reference to singular includes plural embodiments, and vice versa.

Figure 3:
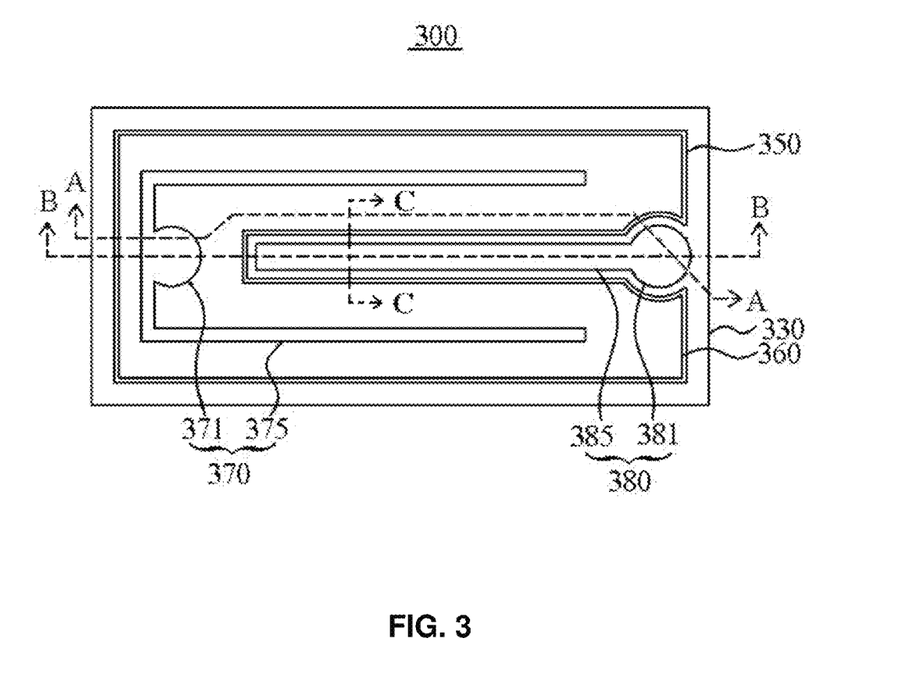
FIG. 3 shows an exemplary embodiment of a semiconductor light emitting device 300 according to the present disclosure.
Figure 4:
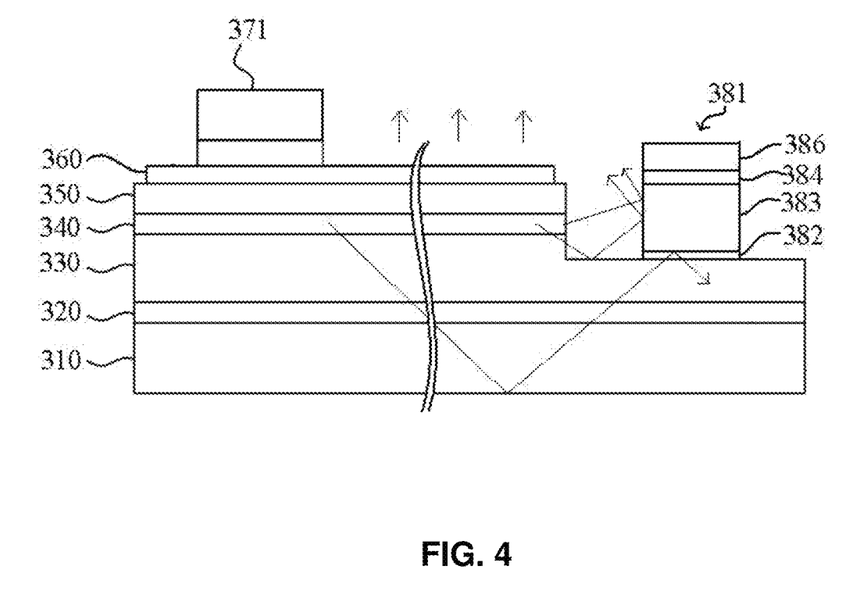
FIG. 4 is a sectional cutaway view of the semiconductor light emitting device 300, taken along line A-A of FIG. 3.

FIG. 3 shows an exemplary embodiment of a semiconductor light emitting device 300 according to the present disclosure, and FIG. 4 is a sectional cutaway view of the semiconductor light emitting device 300, taken along line A-A of FIG. 3.

The semiconductor light emitting device 300 includes a substrate 310, a plurality of semiconductor layers, a first electrode 380, a light-transmitting conductive film 360, and a second electrode 370. The plurality of semiconductor layers includes a buffer layer 320, a first semiconductor layer 330, an active layer 340 and a second semiconductor layer 350, which are stacked over the substrate 310. The buffer layer 320 may be omitted.

In this exemplary embodiment, the first semiconductor layer 330, the second semiconductor layer 350 and the active layer 340 described hereinafter are formed of Group III-V compound semiconductors, in particular, a Group III-nitride semiconductor represented by Al(x)Ga(y)In(1−x−y)N (0≤x≤1, 0≤y≤1, 0≤x+y≤1).

The substrate 310 may be a homogeneous substrate, such as a GaN-based substrate, or a heterogeneous substrate, such as a sapphire substrate, a SiC substrate or a Si substrate, but any type of the substrate is acceptable as long as a Group III nitride semiconductor layer can be grown thereon.

The first semiconductor layer 330 is adapted to have a first conductivity type, and the second semiconductor layer 350 is adapted to have a second conductivity type different from the first conductivity type. The plurality of semiconductor layers of the semiconductor light emitting device 300 according to this exemplary embodiment includes a buffer layer 320, an n-type nitride semiconductor layer 330 (the first semiconductor layer, e.g. an n-type GaN layer), a p-type nitride semiconductor layer 350 (the second semiconductor layer, e.g. a p-type GaN layer), an n-side electrode 380 (a first electrode) and a p-side electrode 370 (a second electrode).

Reference numerals 382, 383, 384 and 386 not mentioned yet at this point will be described later.

Figure 5:
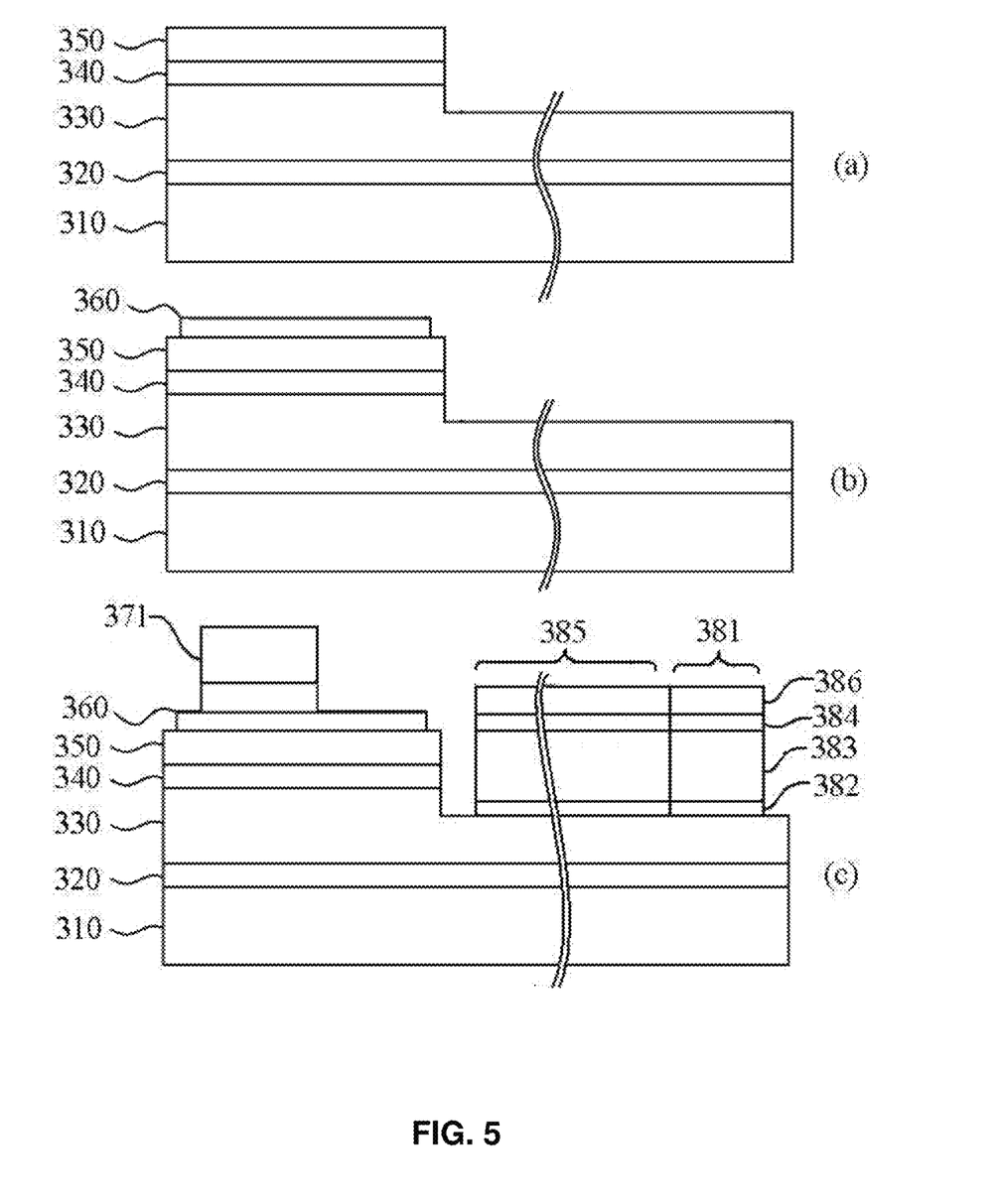
FIG. 5 is a sectional cutaway view of the semiconductor light emitting device 300, taken along line B-B of FIG. 3, illustrating the fabrication process of the semiconductor light emitting device.
Figure 6:
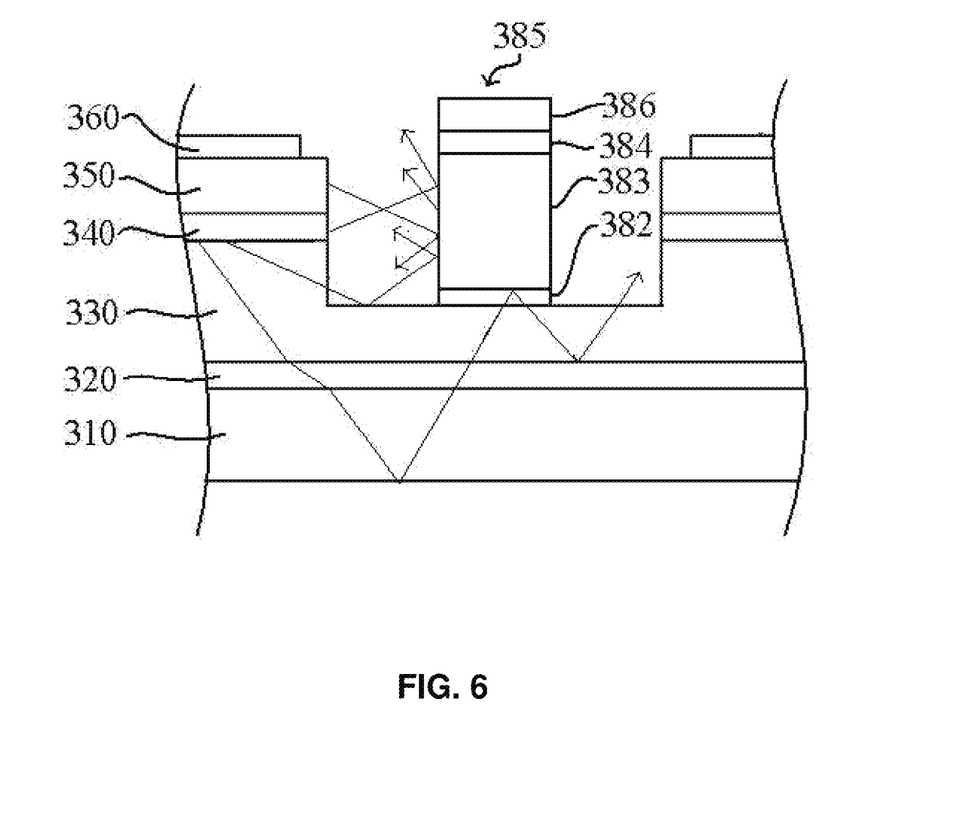
FIG. 6 is a sectional cutaway view of the semiconductor light emitting device 300, taken along line C-C of FIG. 3.

FIG. 5 is a sectional cutaway view of the semiconductor light emitting device 300, taken along line B-B of FIG. 3, illustrating the fabrication process of the semiconductor light emitting device, and FIG. 6 is a sectional cutaway view of the semiconductor light emitting device 300, taken along line C-C of FIG. 3.

Firstly, the n-type nitride semiconductor layer 330, the active layer 340 and the p-type nitride semiconductor layer 350 are formed over the substrate 310. These semiconductor layers epitaxially growing on the substrate 310 are mainly grown by a metal organic chemical vapor deposition (MOCVD) process. If needed, each layer may have sub-layers.

Once the plurality of semiconductor layers is formed over the substrate 310, portions of the p-type nitride semiconductor layer 350, the active layer 340 and the n-type nitride semiconductor layer 330 are etched in mesa form, and as shown in FIG. 5a, a portion of the n-type nitride semiconductor layer 330 including a region facing the n-side electrode 380 is exposed. These multiple semiconductor layers may be removed by dry etching using inductively coupled plasma (ICP) for example.

Then, the light-transmitting conductive film 360 is formed, preferably on the p-type nitride semiconductor layer 350, as shown in FIG. 5b, by sputtering, e-beam evaporation, thermal evaporation or the like. Alternatively, a mesa etching process may be carried out after the light-transmitting conductive film 360 is formed. The light-transmitting conductive film 360 serves to enhance current density uniformity across the p-type nitride semiconductor layer 350. The light-transmitting conductive film 360 is usually made of ITO, ZnO or Ni/Au. The light-transmitting conductive film 360 may be formed on the great part of the light emitting region.

Next, the n-side electrode 380 is formed on the n-type nitride semiconductor layer 330, as shown in FIG. 5c, by sputtering, e-beam evaporation, thermal evaporation or the like, and the p-side electrode 370 may be formed on the light-transmitting conductive film 360.

For example, the n-side electrode 380 includes an n-side bonding pad 381 and an n-side finger electrode 385, and the p-side electrode 370 includes a p-side bonding pad 371 and a p-side finger electrode 375.

The semiconductor light emitting device 300 shown in FIG. 3 has a roughly rectangular planar shape with one side being longer than the other for increasing the size of the device. In other words, the semiconductor light emitting device 300 has long sides and short sides.

The n-side bonding pad 381 and the p-side bonding pad 371 are located on the opposite short sides. The n-side finger electrode 385 stretches out from the p-side bonding pad 381 towards the p-side bonding pad 371, along the center of the semiconductor light emitting device 300. Two p-side finger electrodes 375 extend from the p-side bonding pad 371 and are stretched lengthwise on either side of the n-side finger electrode 385.

The electrodes may be shaped and arranged in diverse manners. For instance, as an alternative to those shown in FIG. 3, at least one of the n-side bonding pad 381 and the p-side bonding pad 371 may be formed on a region of the substrate 310 where the plurality of semiconductor layers are not formed thereon, and the number and arrangement of the n-side and p-side finger electrodes 385 and 375 may vary depending on the size and shape of the semiconductor light emitting device 300. The technical idea of the present disclosure is also applicable to a semiconductor light emitting device without the n-side finger electrode 385 and/or the p-side finger electrode 375. Moreover, considering that a large-area, high-power chip can have multiple bonding pads and multiple finger electrodes, the technical idea of the present disclosure will magnify its advantages when applied to the large-area, high-power chip.

In still another alternative embodiment, the n-type nitride semiconductor layer 330 may be formed on the active layer 340, and the p-type nitride semiconductor layer 350 may be formed beneath the active layer 340; or in this case, the positions of the p-side electrode 370 and the n-side electrode 380 may be switched.

The light generated by the active layer 340 is emitted above, below and lateral sides of the plurality of the semiconductor layers. A considerable amount of the light is emitted to the lateral sides (including mesa-etched faces) of the plurality of the semiconductor layers. Also, a portion of the light is reflected upwards by the substrate 310.

The n-side electrode 380 and the p-side electrode 380 are made of metals having excellent electrical properties and exhibiting excellent adhesion to avoid peeling of the electrodes, and are typically comprised of multiple metallic layers.

The amount of the light which is emitted through the mesa-etched faces of the plurality of semiconductor layers and enters sideways of the n-side bonding pad 381 and the n-side finger electrode 385 is considerably large or too large to be ignored. One way to reduce light absorption would be to make the electrodes shorter. However, instead of reducing the height of the electrodes, this exemplary embodiment introduces a high reflectivity layer, or even a thick, high reflectivity layer to the electrodes, as the electrodes occupy much space in the semiconductor light emitting device 300, and the metals of the electrodes not only absorb light, but they also reflect the light. In other words, this exemplary embodiment proposes a relatively thicker reflective layer than the other layers of the electrode, for better reflection of the light emitted from the mesa-etched faces of the plurality of semiconductor layers. As such, this exemplary embodiment is provided with a feature for preventing possible rupture of the reflective layer, which may occur when the reflective layer is thick. More details on this feature will be described later.

The n-side electrode 385 directly faces the mesa-etched exposed lateral sides of the p-type nitride semiconductor layer 350, the active layer 340 and the n-type nitride semiconductor layer 330, and therefore, the n-side bonding pad 381 or the n-side finger electrode 385 receives the reflected light from the substrate 310 as well as the light from the mesa-etched faces (lateral sides) of the plurality of semiconductor layers. Hence, an effective way to reduce light absorption by the electrodes is to reduce light absorption by the n-side bonding pad 381 or by the n-side finger electrode 385.

FIG. 4 and FIG. 5 show a simplified structure of the p-side electrode 370, without going into a detailed structure. It should be understood that the present disclosure covers any p-side electrode whether or not the p-side electrode 370 has the same layer structure as the n-side electrode 380.

For instance, the n-side bonding pad 381 and the n-side finger electrode 385 include a contact layer 382, a reflective layer 383, an anti-rupture layer 384 and a bonding layer 386 (see FIG. 5 and FIG. 6).

The contact layer 382 may be made of a metal (e.g. Cr or Ti) that exhibits excellent electrical contact properties and excellent adhesion with the n-type nitride semiconductor layer 330. The contact layer 382 may have a thickness ranging from 5 Å to 500 Å.

The reflective layer 383 may be made of a high reflectivity metal (e.g. Al or Ag). For light reflection, the reflective layer 383 may have a thickness of 500 Å or more. To increase the amount of light reflecting off, the reflective layer 383 is preferably 1000 Å to 10000 Å thick, thereby facing the active layer 340. The n-side bonding pad 381 and the n-side finger electrode 385 with such heights shown in FIG. 5c are for illustrative and convenience purposes only.

The reflective layer 383 thus formed is capable of reflecting sufficiently more light coming from the mesa-etched faces of the plurality of semiconductor layers, and this brings about an increased output of the semiconductor light emitting device.

Figure 7:
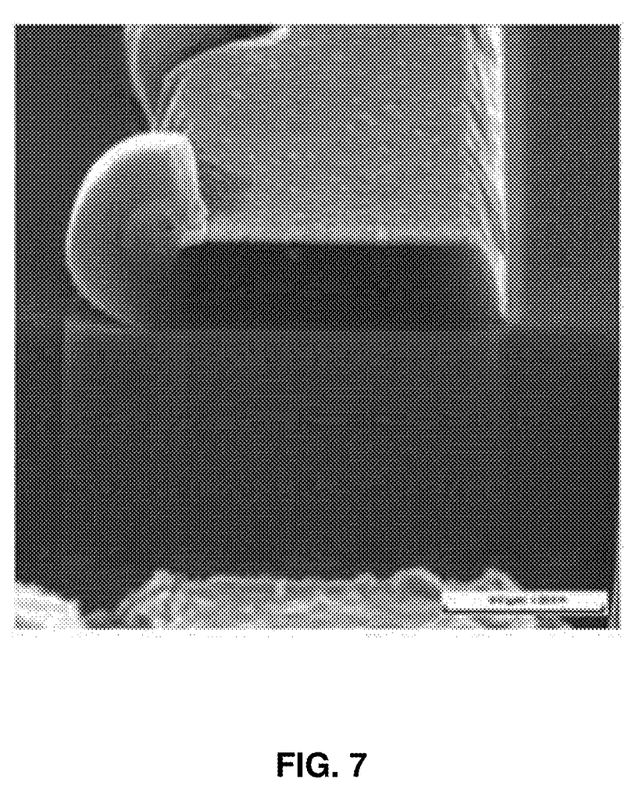
FIG. 7 is a photograph describing rupture of a reflective layer that occurs upon the application of current.

When the reflective layer 383 is made thicker, the anti-rupture layer 384 is adapted to prevent rupture of the reflective layer 383 that occurs upon the application of current (see FIG. 7). This will be described in more detail below.

The bonding layer 386 may be made of a metal (e.g. Au or Al) that exhibits excellent bonding properties for wire bonding of the n-side bonding pad 381.

FIG. 7 is a photograph describing rupture of a reflective layer that occurs upon the application of current for an extended period of time.

It shows that a part of the reflective layer 383 sticks out sideways and pushes the bonding layer 384 (e.g. Au layer) which is the top layer. When the reflective layer 383 is made thick as described above, it may stick out from the sides if the semiconductor light emitting device 300 is supplied with high current and operates at a high temperature. To avoid this defect, the present exemplary embodiment introduces the anti-rupture layer 384 into the n-side bonding pad 381 and n-side finger electrode 385, for preventing the reflective layer 383 from rupturing.

The anti-rupture layer 384 is made of materials for maintaining stable adhesion between the reflective layer 383 and the bonding layer 386, and it is preferably made of a material (e.g. Ni, Ti, Cr, Pt, TiW) that can be served as a diffusion barrier.

The anti-rupture layer 384 is made of materials having a lower linear thermal expansion coefficient than that of the reflective layer 383. For instance, the reflective layer 383 can be made of Al or Ag, and the anti-rupture layer 384 can be made of Ni or Ti. Linear thermal expansion coefficients are: Al=22.2, Ag=19.5, Ni=13, and Ti=8.6, unit: $10^{-6}$ m/mK.

When current is applied to the semiconductor light emitting device 300 and the current flows across the reflective layer 383, heat is generated in the active layer 340 and in those electrodes such as the n-side bonding pad 381 and the n-side finger electrode 385. Then the reflective layer 383 may be thermally expanded by the heat. This expansion (thermal expansion) of the reflective layer 383 is suppressed by the anti-rupture layer 383 having a lower thermal expansion coefficient than that of the reflective layer 383. As a result, the reflective layer 383 will not be ruptured by thermal expansion.

As described above, the n-side bonding pad 381 and the n-side finger electrode 385 may be composed of Cr (382)/Al (383)/Ti (383)/Au (386), as shown in FIG. 5c and FIG. 6. Alternatively, they may be composed in other combinations, including Cr/Ag/Ti/Au, Cr/Al/Ni/Au, Cr/Ag/Ni/Au, Ti/Al/Ti/Au, Ti/Ag/Ti/Au, Ti/Al/Ni/Au, Ti/Ag/Ni/Au or the like.

Meanwhile, if the reflective layer 383 is 0.5 μm or more, the anti-rupture layer 384 should get thicker as well. In this case, the anti-rupture layer 384 itself may crack. If the reflective layer 383 and the anti-rupture layer 384 are deposited alternately, however, the electrode structure can become more stable. One example of such structure including the contact layer, the alternating layers and the bonding layer will be Cr (20 Å)/Al (3 kÅ)/Ni (3 kÅ)/Al (3 kÅ)/Ni (3 kÅ)/Au (10 kÅ). Here, the thickness of the anti-rupture layer 384 is also an important factor for a stable electrode. A proper relationship between the reflective layer 383 thickness and the anti-rupture layer 384 thickness will be explained with reference to FIG. 8.

Figure 8:
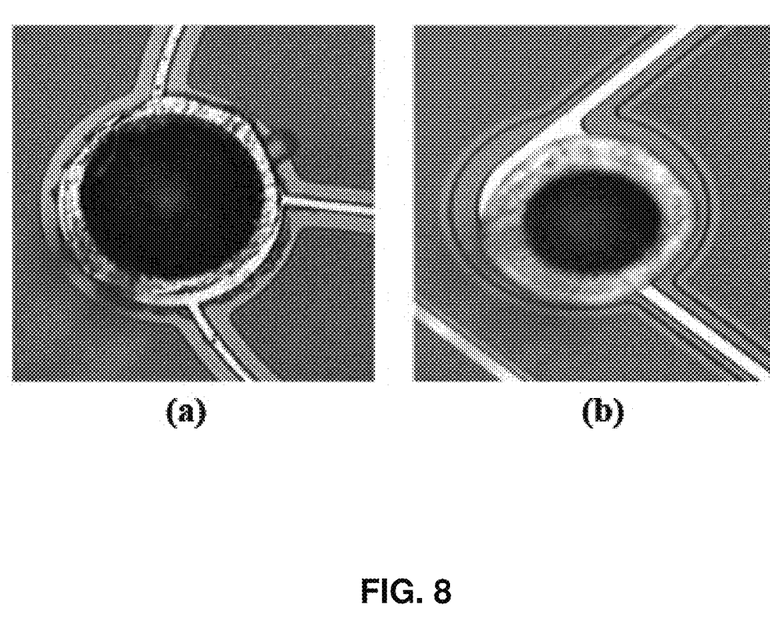
FIG. 8 shows photographs describing the stability of an electrode in relation to the thickness of the reflective and anti-rupture layers.

FIG. 8 shows photographs describing the stability of an electrode in relation to the thickness of the reflective and anti-rupture layers.

FIG. 8 (a) is a photograph which shows the ruptured state of a reflective layer included in the alternating layers of Al (3 kÅ) and Ni (200 Å) (two bi-layers), i.e. 2×[Al (3 kÅ)/Ni (200 Å)] with Al being the reflective layer 383 and Ni being the anti-rupture layer 384. As can be seen in FIG. 8 (a), the reflective layer has stuck out sideways.

FIG. 8 (b) is a photograph which shows the non-ruptured state of a reflective layer included in the alternating layers of Al (3 kÅ) and Ni (3 kÅ) (two bi-layers), i.e. 2×[Al (3 kÅ)/Ni (3 kÅ)] with Al being the reflective layer 383 and Ni being the anti-rupture layer 384. As can be seen in FIG. 8 (b), the reflective layer has not stuck out sideways.

After a number of tests were done, varying the thickness ratio between the reflective layer 383 and the anti-rupture layer 384 and the number of the alternating reflective layer/anti-rupture layer pairs, it was discovered that satisfactory anti-rupture effect could be obtained when the thickness of the anti-rupture layer 384 falls between 20% and 200% of the thickness of the reflective layer 383, for preventing rupture of the reflective layer 383. The result remained valid and significant whether or not there is one pair of the reflective layer/anti-rupture layer or multiple pairs of the reflective layer/anti-rupture layer.

If the thickness of the anti-rupture layer 384 is less than 20% of the thickness of the reflective layer 383, ruptures may occur. If the thickness of the anti-rupture layer 384 is more than 200% of the thickness of the reflective layer 383, the stability of the electrode may be damaged due to a crack in the anti-rupture layer 384 itself. A suitable thickness for the reflective layer 383 preferably ranges from 1000 Å to 10,000 Å, and the thickness of the anti-rupture layer 384 is preferably between 20% and 200% of the thickness of the reflective layer 383. In other words, the reflection area is increased and at the same time the reflective layer is prevented from rupturing, preferably when the thickness ratio between the reflective layer 383 and the anti-rupture layer 384 falls between 20% and 200% and when multiple pairs of the reflective layer 383 and the anti-rupture layer 384 are formed in an alternating manner.

Therefore, in this exemplary embodiment, the reflective layer 383 having at least a certain thickness is preferably formed upon the formation of the n-side bonding pad 381 and the n-side finger electrode 385, such that a larger amount of the light emitted from the mesa-etched faces can be reflected. In addition, the anti-rupture layer 384 and the reflective layer 383 are preferably formed at a thickness ratio within a specific range, and an increased number of reflective layer/the anti-rupture layer pairs are deposited in an alternating manner, thereby preventing rupture of the reflective layer 383.

Figure 9:
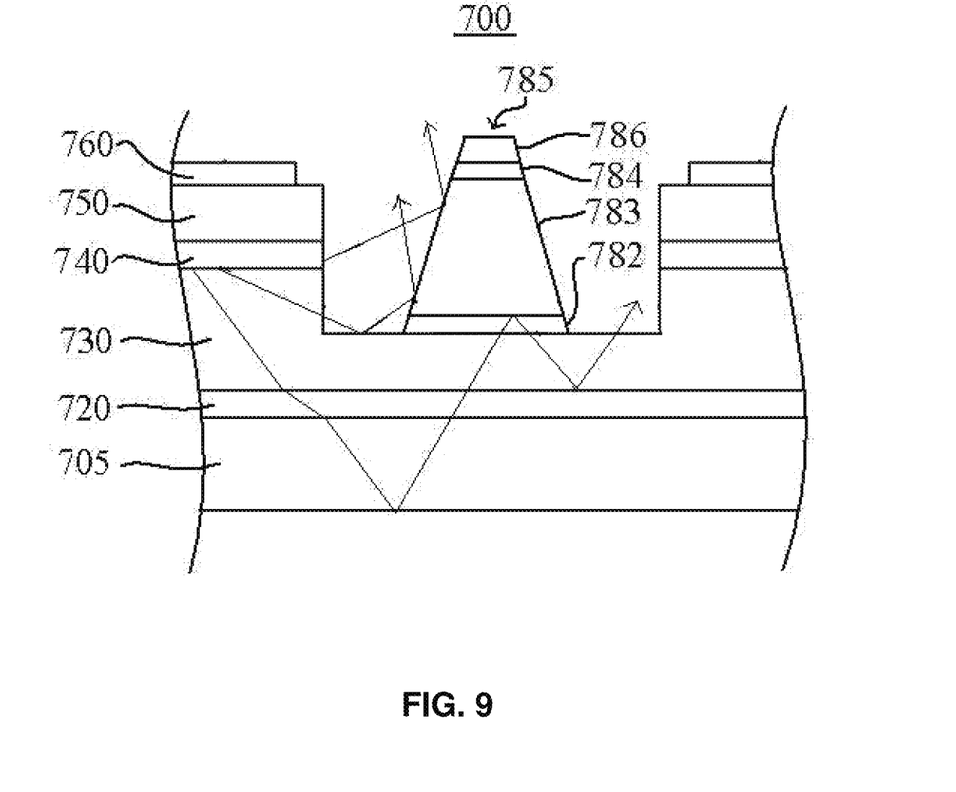
FIG. 9 shows another exemplary embodiment of a semiconductor light emitting device according to the present disclosure.

FIG. 9 shows another exemplary embodiment of a semiconductor light emitting device 700 according to the present disclosure.

The semiconductor light emitting device 700 is substantially identical with the semiconductor light emitting device 300 described with reference to FIG. 3 through FIG. 8, except that the semiconductor light emitting device 700 includes an n-side finger electrode 785 and an n-side bonding pad which have lateral sides formed at an oblique angle with respect to a direction normal to a substrate 705. As shown in FIG. 9, the semiconductor light emitting device 700 includes a buffer layer 720, a first semiconductor layer 730, an active layer 740, a second semiconductor layer 750, a light-transmitting conductive film 760, a contact layer 782, a reflective layer 783, an anti-rupture layer 784 and a bonding layer 786.

For example, the n-side bonding pad and the n-side finger electrode 785 are composed of Cr/Al/Ti/Au, and have a trapezoidal cross section as the lateral sides are formed at an oblique angle with respect to a direction normal to the substrate 705, as shown in FIG. 9. In this way, a larger amount of the light emitted from the plurality of semiconductor layers can be reflected upwards by the n-side bonding pad and the n-side finger electrode 785.

In short, the semiconductor light emitting device of the present disclosure includes a reflective layer having an increased thickness to cause a larger amount of the light emitted from the lateral sides (e.g. the mesa-etched faces) of the plurality of semiconductor layers to be reflected and incident on the electrodes, and an anti-rupture layer for preventing this thick reflective layer from rupturing. While the semiconductor light emitting device of the present disclosure may be applied regardless of the size, it is particularly advantageous for enhancing the output of the semiconductor light emitting device when applied to a large-area, high-power semiconductor light emitting device (e.g. the semiconductor light emitting device shown in FIG. 2).

The following describes various exemplary embodiments of the present disclosure.

(1) A semiconductor light emitting device, characterized by including an anti-rupture layer having a thickness between 0.2 and 2 times of the thickness of a reflective layer.

The adhesive force between the anti-rupture layer and the reflective layer prevents the reflective layer from sticking out sideways upon the application of current.

(2) A semiconductor light emitting device, characterized by including a reflective layer having a thickness between 1000 Å and 10000 Å.

(3) A semiconductor light emitting device, characterized by including a reflective layer made of at least one selected from Al and Ag, and an anti-rupture layer made of at least one selected from Ni, Ti, Cr, Pt and TiW.

(4) A semiconductor light emitting device, characterized by including multiple pairs of a reflective layer and an anti-rupture layer deposited in an alternating manner.

(5) A semiconductor light emitting device, characterized by including a reflective layer having a thickness between 5000 Å and 10000 Å.

(6) A semiconductor light emitting device, characterized by including multiple pairs of reflective layer/anti-rupture layer deposited in an alternating manner, with the anti-rupture layer having a thickness between 0.2 to 2 times of the thickness of the reflective layer.

(7) A semiconductor light emitting device, characterized by including a first electrode which has: a first bonding pad including a contact layer, a reflective layer, an anti-rupture layer, and a bonding layer formed on the anti-rupture layer and electrically connected to outside; and a first finger electrode including a contact layer, a reflective layer, an anti-rupture layer and a bonding layer formed on the anti-rupture layer, wherein the first finger electrode is extended over a mesa-etched exposed region of a first semiconductor layer and electrically connected with the first bonding pad.

FIG. 3 through FIG. 8 illustrated that the n-side bonding pad 381 and the n-side finger electrode 385 have the same layer structure, but it is not absolutely necessary for them to have the same layer structure, provided the reflective layer in a high light absorption loss region is made taller than other layers such as the bonding layer. For example, suppose that light absorption by the n-side finger electrode 385 seems to be a bigger problem than light absorption by the n-side bonding pad 381. Then, even if the n-side bonding pad 381 is composed of Cr/Al/Ti/Au, the n-side finger electrode 385 may be composed of Cr/Al or Cr/Ag, and the Al layer (the finger electrode reflective layer) of the n-side finger electrode 385 may be made taller than each of the other layers of the n-side bonding pad 381.

The technical idea according to the present disclosure is also applicable to a semiconductor light emitting device with a bonding pad but without any finger electrode.

(8) A semiconductor light emitting device, characterized by including a reflective layer of which lateral sides are formed at an oblique angle with respect to a direction normal to a first semiconductor layer.

(9) A semiconductor light emitting device, characterized in that the semiconductor includes a Group III-nitride semiconductor, and the device includes a second electrode electrically connected with a second semiconductor layer, and multiple pairs of reflective layer Al (or Ag)/anti-rupture layer Ni (or Ti) deposited in an alternating manner, wherein in the multiple pairs of the reflective layer/anti-rupture layer deposited, the reflective layer has a thickness between 1000 Å and 10000 Å, and the anti-rupture layer has a thickness between 0.2 and 2 times of the thickness of the reflective layer.

In one aspect, the semiconductor light emitting device according to the present disclosure has an enhanced output due to an increased amount of reflected light by the electrodes.

In another aspect, the semiconductor light emitting device according to the present disclosure has improved reliability by preventing rupture of the electrodes upon the application of current.

What is claimed is:

1. A semiconductor light emitting device comprising:
    a plurality of semiconductor layers which includes a first semiconductor layer having a first conductivity type, a second semiconductor layer having a second conductivity type different from the first conductivity type, and an active layer arranged between the first semiconductor layer and the second semiconductor layer and adapted to generate light by electron-hole recombination; and
    a first electrode which is formed on an exposed region of the first semiconductor layer created by mesa etching portions of the second semiconductor layer, the active layer and the first semiconductor layer, and includes a contact layer in contact with the first semiconductor layer, a reflective layer formed on the contact layer, while facing an exposed region of the active layer created by mesa etching and reflecting light, and an anti-rupture layer formed on the reflective layer, wherein the reflective layer has a higher reflectivity than that of the anti-rupture layer and a thickness of at least 500 Å, and the anti-rupture layer has a lower thermal expansion coefficient than that of the reflective layer, thereby preventing rupture of the reflective layer occurring upon the application of power;
    wherein the reflective layer has a thickness between 1000 Å and 10000 Å, the anti-rupture layer has a thickness of 0.2 times or more of the thickness of the reflection layer to prevent rupture of the reflection layer, and the anti-rupture layer has a thickness of two times or less of the thickness of the reflective layer to prevent cracking of the anti-rupture layer;
    wherein the reflective layer having a thickness between 1000 Å and 10000 Å faces a lateral side of the active layer in such a manner that the reflective layer increases the amount of light reflecting off.

2. The semiconductor light emitting device according to claim 1, wherein the reflective layer is comprised of at least one selected from Al and Ag, and the anti-rupture layer is comprised of at least one selected from Ni, Ti, Cr, Pt and TiW.

3. The semiconductor light emitting device according to claim 1, wherein multiple pairs of the reflective layer and the anti-rupture layer are deposited in an alternating manner.

4. The semiconductor light emitting device according to claim 3, wherein the reflective layer has a thickness between 5000 Å and 10000 Å.

5. The semiconductor light emitting device according to claim 1, wherein the first electrode comprises:
    a first bonding pad including a contact layer, a reflective layer, an anti-rupture layer, and a bonding layer formed on the anti-rupture layer and electrically connected to outside; and
    a first finger electrode including a contact layer, a reflective layer, an anti-rupture layer and a bonding layer formed on the anti-rupture layer, the first finger electrode being extended over a mesa-etched exposed region of a first semiconductor layer and electrically connected with the first bonding pad.

6. The semiconductor light emitting device according to claim 1, wherein the reflective layer has lateral sides formed at an oblique angle with respect to a direction normal to the first semiconductor layer.

7. The semiconductor light emitting device according to claim 1, wherein the semiconductor comprises a Group III-nitride semiconductor; and the device comprises a second electrode electrically connected with the second semiconductor layer, and multiple pairs of reflective layer made of Al or Ag/anti-rupture layer Ni or Ti deposited in an alternating manner.

* * * * *